US009460249B2

(12) United States Patent
Hindle (10) Patent No.: US 9,460,249 B2
(45) Date of Patent: Oct. 4, 2016

(54) VERIFICATION OF ASYNCHRONOUS CLOCKING SYSTEMS

(75) Inventor: Robert Hindle, Bristol (GB)

(73) Assignee: STMICROELECTRONICS (RESEARCH & DEVELOPMENT) LIMITED, Marlow Bucks (GB)

(*) Notice: Subject to any disclaimer, the term of this patent is extended or adjusted under 35 U.S.C. 154(b) by 473 days.

(21) Appl. No.: 13/253,726

(22) Filed: Oct. 5, 2011

(65) Prior Publication Data
US 2012/0144225 A1 Jun. 7, 2012

(30) Foreign Application Priority Data
Oct. 5, 2010 (GB) .................................. 1016710.4

(51) Int. Cl.
*G06F 1/00* (2006.01)
*G06F 17/50* (2006.01)
*G06F 1/04* (2006.01)

(52) U.S. Cl.
CPC ....... *G06F 17/5022* (2013.01); *G06F 2217/62* (2013.01)

(58) Field of Classification Search
CPC .................................. G06F 17/50; G06F 1/04
USPC ........ 713/500; 703/116, 119; 716/1; 327/291
See application file for complete search history.

(56) References Cited

U.S. PATENT DOCUMENTS

| 6,570,428 | B1 * | 5/2003 | Liao et al. ..................... 327/291 |
| 6,598,191 | B1 * | 7/2003 | Sharma et al. ................ 714/726 |
| 6,653,875 | B2 * | 11/2003 | Partsch .................. H03L 7/0802 327/149 |
| 7,289,946 | B1 * | 10/2007 | Lee ................................. 703/16 |
| 7,382,824 | B1 * | 6/2008 | Marmash et al. ............. 375/224 |
| 7,617,409 | B2 * | 11/2009 | Gilday et al. .................. 713/503 |
| 7,640,151 | B2 * | 12/2009 | Smith et al. ..................... 703/14 |
| 7,904,859 | B2 * | 3/2011 | Maixner et al. ............... 716/105 |
| 8,362,482 | B2 * | 1/2013 | Or-Bach et al. ................ 257/48 |
| 2002/0138780 | A1 * | 9/2002 | Bock .............................. 713/500 |
| 2005/0060597 | A1 * | 3/2005 | Albonesi et al. ............. 713/600 |
| 2005/0144580 | A1 * | 6/2005 | Berkram .............. G06F 17/5022 716/108 |
| 2005/0216247 | A1 | 9/2005 | Ikeda et al. |
| 2006/0047494 | A1 * | 3/2006 | Tamura ............... G06F 17/5036 703/19 |
| 2006/0271806 | A1 * | 11/2006 | Castano et al. ............... 713/500 |
| 2006/0277428 | A1 * | 12/2006 | Ganesan et al. .............. 713/500 |
| 2007/0016817 | A1 * | 1/2007 | Albonesi et al. ............. 713/500 |
| 2007/0035428 | A1 * | 2/2007 | Badaroglu ..................... 341/143 |
| 2007/0255974 | A1 * | 11/2007 | Gilday et al. .................. 713/503 |
| 2007/0283305 | A1 * | 12/2007 | Reddy et al. ...................... 716/6 |
| 2008/0005709 | A1 * | 1/2008 | Golander .......................... 716/6 |
| 2008/0069277 | A1 * | 3/2008 | Derti et al. .................... 375/354 |
| 2008/0072197 | A1 | 3/2008 | Ja et al. |
| 2008/0198957 | A1 | 8/2008 | Kowatari |
| 2009/0037860 | A1 | 2/2009 | Kanno |
| 2009/0063086 | A1 * | 3/2009 | Kawasaki ..................... 702/117 |
| 2009/0182545 | A1 | 7/2009 | Walter et al. |
| 2010/0194434 | A1 * | 8/2010 | Tran Vo et al. ................ 326/93 |
| 2011/0295586 | A1 * | 12/2011 | Yin et al. ........................ 703/21 |

OTHER PUBLICATIONS

British Search Report dated Dec. 20, 2011 in connection with British Application No. GB1016710.4.

* cited by examiner

*Primary Examiner* — Henry Tsai
*Assistant Examiner* — Christopher A Daley
(74) *Attorney, Agent, or Firm* — Allen, Dyer, Doppelt, Milbrath & Gilchrist, P.A.

(57) ABSTRACT

A circuit simulator includes at least one clock generator. The at least one clock generator is configured to generate at least one root clock signal for an associated clock domain part of the circuit under simulation. The circuit simulator also includes a clock modifier configured to generate at least one delay to be applied to at least one of the at least one root clock signal.

19 Claims, 4 Drawing Sheets

VERIFICATION OF ASYNCHRONOUS CLOCKING SYSTEMS

CROSS-REFERENCE TO RELATED APPLICATIONS

The present application is related to United Kingdom Patent Application No. 1016710.4, filed Oct. 5, 2010, entitled "VERIFICATION". United Kingdom Patent Application No. 1016710.4 is assigned to the assignee of the present application and is hereby incorporated by reference into the present disclosure as if fully set forth herein. The present application hereby claims priority under 35 U.S.C. §119(a) to United Kingdom Patent Application No. 1016710.4.

TECHNICAL FIELD

The present invention relates to verification for integrated circuits, for example but not exclusively, to verification of integrated circuit during integrated circuit design.

BACKGROUND

Typically an electronic circuit comprises a plurality of different sub-circuits which may be responsible for performing different functions. For example, an integrated circuit is typically constructed of a plurality of individual circuit elements. In such circuitry it is often a requirement to propagate a common signal to the different circuit elements which make up to a particular electronic circuit.

In the world of digital circuit design, designers are often required to create multi-clock designs or multi-domain clock designs. Multi clock implies that a design has at least two clocks, but possibly many more clocks, that are asynchronous. Furthermore the digital designs will include at least one, although possibly multiple signals, across the boundaries between the clock environments. If the signals are not synchronised then the circuit will develop errors.

Systems are known for controlling the transfer of a signal, which is propagated from a first circuit element in a first clocking domain, to a second circuit element in a second clocking domain, and wherein the first and second clocking domains are asynchronous. In the past, one way of handling the asynchronous clock domains was by the timing the signal clock into the second clock again, and ensuring the rate of change and the pulse width is acceptable between the domains. However this approach relies on knowing the rate and pulse width so is typically is only used for regular timing reference signals. A further way of handling asynchronous clock domains in the past was by using software to update a register held in each specific clock domain where in the registers being accessible via an asynchronous bridge.

If one were to consider for example an integrated circuit having a plurality of circuit elements, each of which having their own clock, and each having to act on a common signal, then it will be appreciated that it is necessary to adequately test or verify the synchronization of these circuit elements such that the integrated circuit as a whole when manufactured or realized will not develop any errors.

The testing and verification of the system on chip designs are further complicated by the various permutations of the asynchronous clock boundaries. It would not be practical to generate tests for each boundary where the arrival of either clock edge could be undefined. This is because it would typically require repeating a potentially long test with clock domains programmed at varying relative frequencies and phases to highlight potential design flaws in request-grant and valid-ACK type asynchronous handover schemes.

It is known that in some verification environment configurations a rule based hardware description language (HDL) verification or property checking can be implemented. However these rule based verifications do not pick up on design errors in all situations as the intention of the function is not always well defined to the tool.

SUMMARY

It is an aim of embodiments of the present application to overcome these problems by providing a clock domain jitter or delay to be applied during verification and testing of the functional aspects of the integrated circuit.

According to a first aspect, there is provided a circuit simulator comprising: at least one clock generator configured to generate at least one root clock signal for an associated clock domain part of the circuit under simulation; and a clock modifier configured to generate at least one delay to be applied to at least one of the at least one root clock signal.

The clock modifier may comprise a delay determiner configured to determine at least one value representing the at least one delay.

Each of the at least one value representing the at least one delay is configured to be a pseudo-random value.

The delay determiner may comprise at least one of: a pseudo-random value determiner; a deterministic value determiner; a non-linear value determiner; a UNIFORM value determiner; a chaotic value determiner; and a deterministic random value determiner.

The clock modifier may further comprise a seed generator configured to determine at least one seed value, wherein the delay determiner may be configured to determine the at least one value based on the at least one seed value.

The at least one seed value may be a real positive value defined using tool command language.

The at least one root clock generator may be configured to apply the associated at least one delay at the initial clock edge.

The associated clock domain part of the circuit under simulation may be at least one of: a gate level simulation; and a register transfer level simulation.

The circuit simulator may further comprise a verifier configured to verify the circuit under simulation.

The circuit simulator may further be configured to be an integrated circuit simulator.

According to a second aspect, there is provided a method comprising: generating at least one root clock signal for an associated clock domain part of a circuit under simulation; and generating at least one delay to be applied to at least one of the at least one root clock signal.

Generating at least one delay to be applied to at least one of the at least one root clock signal may comprise determining at least one value representing the at least one delay.

Each of the at least one value representing the at least one delay is configured to be a pseudo-random value.

Determining at least one value representing the at least one delay may comprise at least one of: determining a pseudo-random value; determining a deterministic value; determining a non-linear value; determining a UNIFORM value; determining a chaotic value; and determining a deterministic random value.

Generating at least one delay to be applied to at least one of the at least one root clock signal may further comprise determining at least one seed value, wherein determining at least one value representing the at least one delay may comprise determining the at least one value based on the at least one seed value.

Determining the at least one seed value may comprise defining the at least one seed value using tool command language.

Generating at least one root clock signal may comprise applying the associated at least one delay at the initial clock edge.

The method may further comprise gate level simulating the at least one clock domain part of the circuit.

The method may further comprise register transfer level simulating the at least one clock domain part of the circuit.

The method may further comprise simulating an integrated circuit.

A method of verifying a circuit design may comprise the method as discussed herein.

According to a third aspect there is provided an apparatus comprising at least one processor and at least one memory including computer code, the at least one memory and the computer code configured to with the at least one processor cause the apparatus to at least perform: generating at least one root clock signal for an associated clock domain part of a circuit under simulation; and generating at least one delay to be applied to at least one of the at least one root clock signal.

Generating at least one delay to be applied to at least one of the at least one root clock signal may further cause the apparatus to perform determining at least one value representing the at least one delay.

Each of the at least one value representing the at least one delay is configured to be a pseudo-random value.

Determining at least one value representing the at least one delay may causes the apparatus to perform at least one of: determining a pseudo-random value; determining a deterministic value; determining a non-linear value; determining a UNIFORM value; determining a chaotic value; and determining a deterministic random value.

Generating at least one delay to be applied to at least one of the at least one root clock signal may further cause the apparatus to perform determining at least one seed value, wherein determining at least one value representing the at least one delay may cause the apparatus to perform determining the at least one value based on the at least one seed value.

Determining the at least one seed value may cause the apparatus to perform defining the at least one seed value using tool command language.

Generating at least one root clock signal may cause the apparatus to perform applying the associated at least one delay at the initial clock edge.

The apparatus may be further caused to perform gate level simulating the at least one clock domain part of the circuit The apparatus may be further caused to perform register transfer level simulating the at least one clock domain part of the circuit.

The apparatus may be further caused to perform simulating an integrated circuit.

A system may comprise the apparatus as discussed herein.

According to a fourth aspect there is provided an apparatus comprising: means for generating at least one root clock signal for an associated clock domain part of a circuit under simulation; and means for generating at least one delay to be applied to at least one of the at least one root clock signal.

The means for generating at least one delay to be applied to at least one of the at least one root clock signal may further comprise means for determining at least one value representing the at least one delay.

Each of the at least one value representing the at least one delay is configured to be a pseudo-random value.

The means for determining at least one value representing the at least one delay may comprise at least one of: means for determining a pseudo-random value; means for determining a deterministic value; means for determining a non-linear value; means for determining a UNIFORM value; means for determining a chaotic value; and means for determining a deterministic random value.

The means for generating at least one delay to be applied to at least one of the at least one root clock signal may further comprise means for determining at least one seed value, wherein the means for determining at least one value representing the at least one delay may comprise means for determining the at least one value based on the at least one seed value.

The means for determining the at least one seed value may further comprise means for defining the at least one seed value using tool command language.

The means for generating at least one root clock signal may comprise means for applying the associated at least one delay at the initial clock edge.

The apparatus may further comprise means for gate level simulating the at least one clock domain part of the circuit.

The apparatus may further comprising means for register transfer level simulating the at least one clock domain part of the circuit.

The apparatus may be further configured to simulate an integrated circuit.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
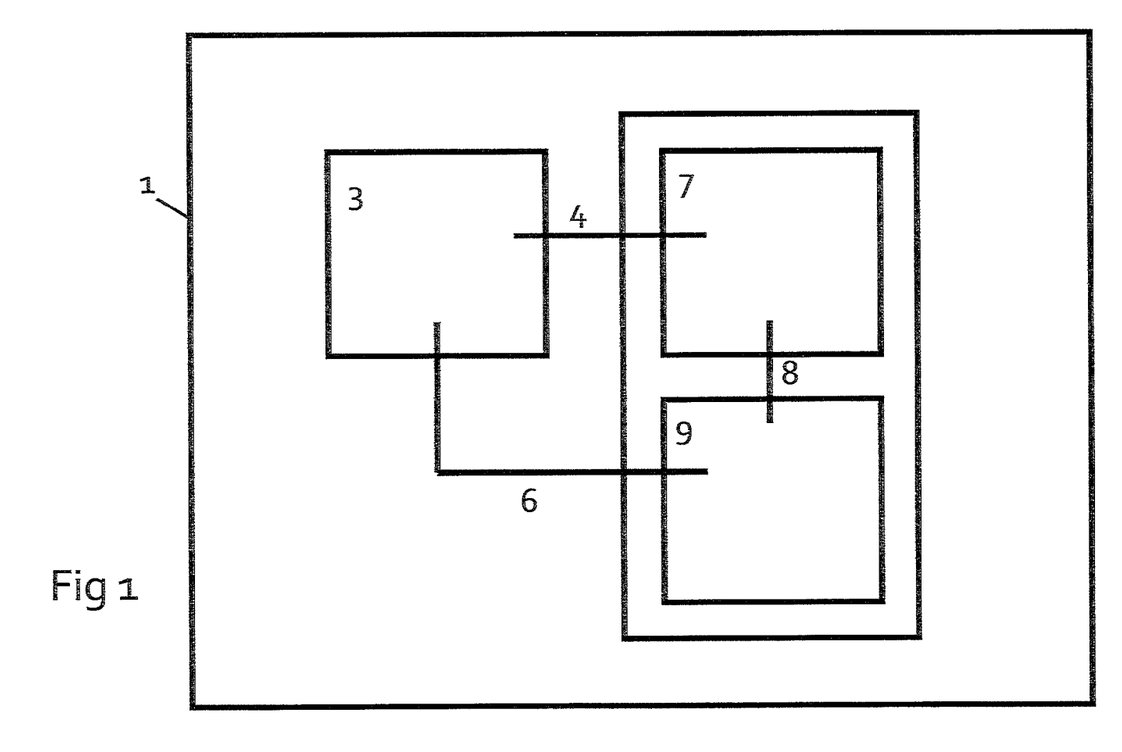
FIG. 1 shows schematically a typical system on chip arrangement suitable for verifying according to some embodiments of the application.

Reference is first made to FIG. 1 which shows an example system on chip (SoC) multi-clock domain environment. The system on chip (SoC) environment is an example of the type of environment suitable for being verified using embodiments of the application. Although the examples discussed herein concern SoC designs for SoC integrated circuit implementations it would be understood that some embodiments of the application can be implemented in verification and/or design stages for any integrated circuit or circuit design where multiple clock domains exist.

The SoC 1 can, in some embodiments, comprise at least two clock domains. In the example shown in FIG. 1, the SoC comprises three clock domains; a first clock domain part 3, which is configured to operate based on a first clock signal, a second clock domain part 7, which is configured to operate based on a second clock signal, and a third clock domain part 9, which is configured to operate based on a third clock signal. It would be appreciated that in some embodiments there could be more or fewer clock domains within a SoC design required to be verified.

As also shown in the example shown in FIG. 1, in some embodiments, more than one clock domain part can lie or be part of a clock domain group such as shown by a first clock domain group 5, which covers the second 7 and third 9 clock domain parts.

In some embodiments, the SoC is capable of demonstrating interaction between the clock domains. For example, in FIG. 1 the first clock domain part 3 and the second clock domain part 7 can be configured to interact by a first coupling 4, which defines an asynchronous clock boundary between the first clock domain part 3 and the second clock domain part 7. Furthermore, as shown in this example further interaction can occur between the other clock boundaries. For example, an asynchronous clock boundary between the second clock domain part 7 and the third clock domain part 9 can be defined by the second coupling 8 between the second clock domain part 7 and the third clock domain part 9. Furthermore, another asynchronous clock boundary between the first clock domain part 3 and the third clock domain part 9 can be defined by the third coupling 6 between the first clock domain part 3 and the third clock domain part 9. Although three clock domains and three clock boundaries are shown in the example FIG. 1, it would be understood that there may be more or fewer clock boundaries between the clock domain parts of the System on Chip (SoC) being verified.

The design and specifically the testing or simulation or verification of a SoC (and/or the design of the SoC testing/simulation/verification process) can in some embodiments be performed by a verifier 51.

The verifier 51, verification apparatus or verifier apparatus can, for example, be any suitable processor means such as a computer. In some embodiments, the verifier is a part of a design suite, which may furthermore perform simulation and/or testing of the design.

In some embodiments, the verifier apparatus incorporates a processor. The processor can, in some embodiments, be further configured to execute various program codes. The implemented program codes can, for example, be a register transfer level (RTL) simulation or a gate level simulation.

In some embodiments, the verifier apparatus can further incorporate a memory. The memory in some embodiments is coupled to the processor. The memory can be implemented as any suitable storage means, for example random access memory (RAM), read-only memory (ROM) or electronically programmable memory. In some embodiments, the memory can comprise a program code section for storing program codes implementable on the processor. Furthermore in some embodiments, the memory can further comprise a stored data section for storing data, for example data which has been encoded in accordance with the application or data to be encoded via the application embodiments as described herein. The implemented program code stored within the program code section, and the data stored within the stored data section can be retrieved, in some embodiments, by the processor whenever needed via a memory-processor coupling. In some embodiments the verifier apparatus 51 can be configured to define the SoC on such a processor as a series of instructions or programs. For example, the circuitry performing the register transfer level or gate level simulation can be encoded using hardware description language such as, in some embodiments, the very high speed integrated circuit hardware description language (VHDL) which can be used to model each individual register level or gate level of the system on chip design.

In some further embodiments, the verifier apparatus can comprise a user interface. The user interface can, in some embodiments, be coupled to the processor. In some embodiments, the processor can control the operation of the user interface and receive input from the user interface. In some embodiments, the user interface can enable a user to input commands to the verifier apparatus, for example, via a keypad, and/or to obtain information from the verifier apparatus, for example via a display which is part of the user interface. The user interface can, in some embodiments, be implemented as a touch-screen or a touch-interface and be configured to both enable information to be entered to the audio capture apparatus and to further display information to the user from the audio capture apparatus.

In some embodiments, the verifier apparatus can further be coupled to enable communication with further or other apparatus or electronic devices.

Figure 2:
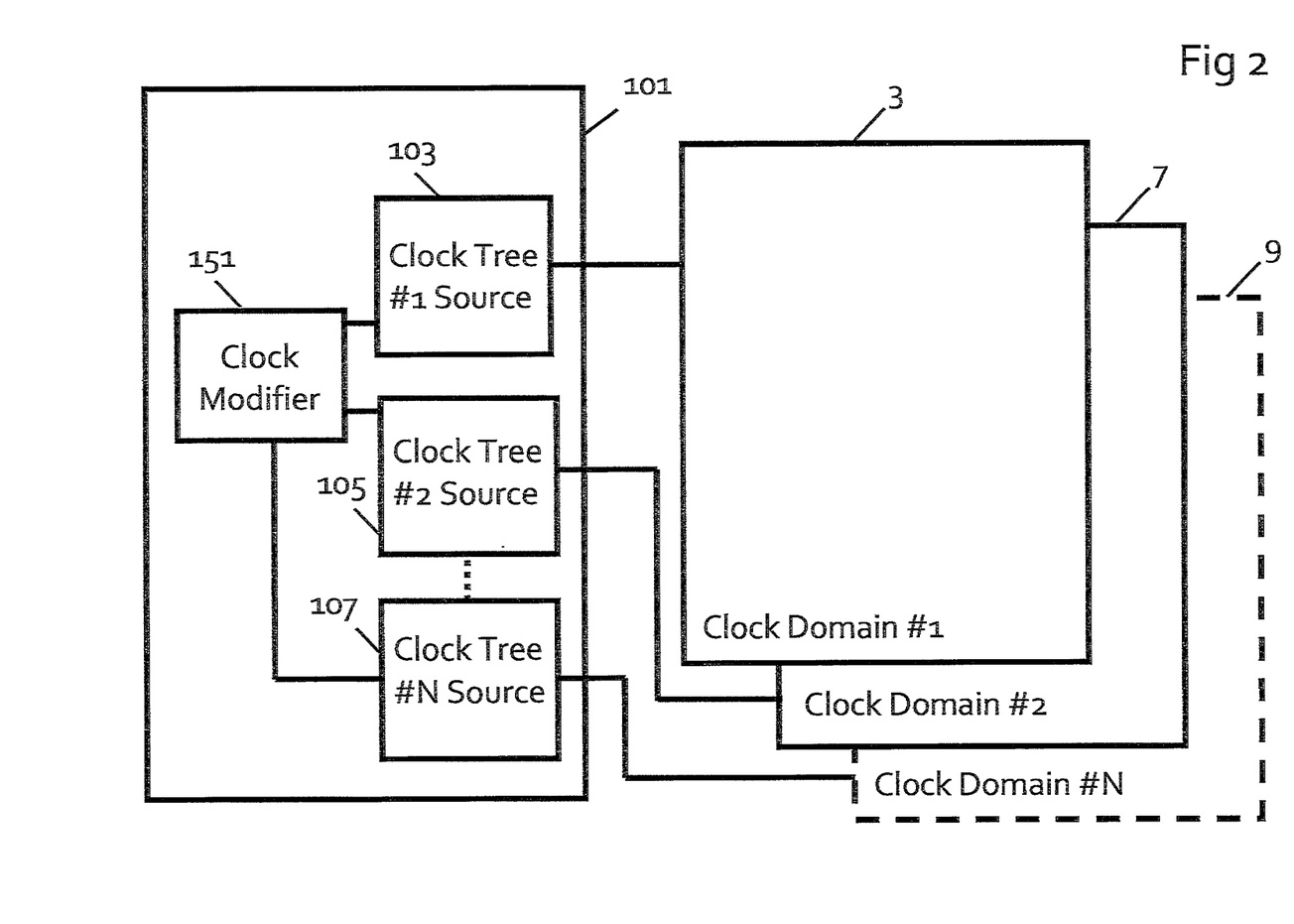
FIG. 2 shows schematically a system on chip arrangement according to some embodiments of the application.

With respect to FIG. 2, a schematic overview of the verification apparatus 51 with respect to clock generation for the clock domains of the SoC design is shown.

In such embodiments, the verification apparatus 51 comprises a clock generator 101. The clock generator 101 is configured, in such embodiments, to generate a series of clock signals each of which is used as a clock signal to operate the verification process in each of the clock domains. Thus for example as shown in FIG. 2, in some embodiments, the clock generator 101 can comprise a first clock tree source 103 configured to output a first root clock signal for the verification/testing of the first clock domain 3, a second clock tree source 105 configured to output a second root clock signal for the verification/testing of the second clock domain 7, and a n'th clock tree source 107 configured to output a n'th clock domain signal root for the verification/testing of the n'th clock domain 9 (where for the example shown in FIG. 1 n=3).

Furthermore as in FIG. 2, the clock generator 101, in some embodiments, further comprises a clock modifier 151. The clock modifier 151 is configured to provide a defined or modelled, tunable and seeded random jitter or delay into the source of each clock tree source. This jitter or delay insertion can be applied to either the register transfer level or to a gate level simulation. The clock modifier 151 thus can generate the constant re-skewing of clock edges with respect to each clock domain throughout the running of a complete test suite.

Figure 3:
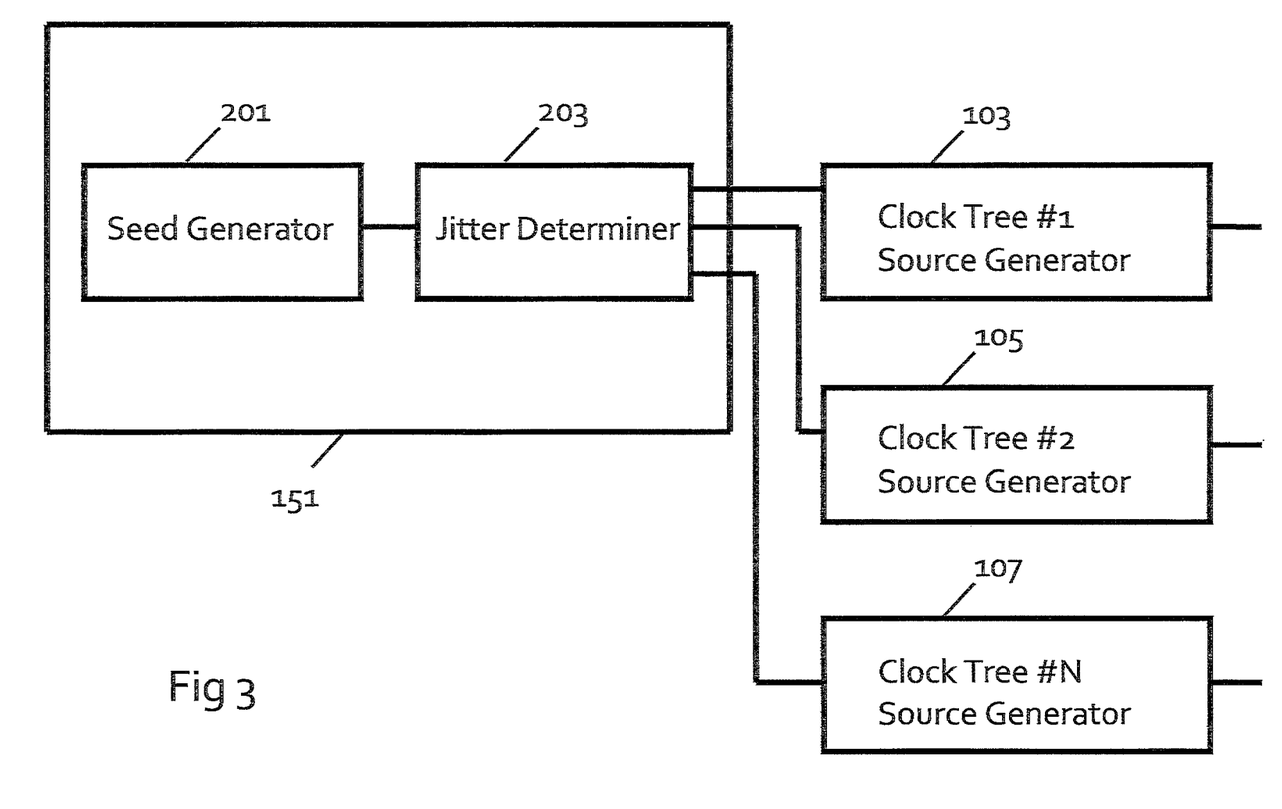
FIG. 3 shows schematically the root clock generator shown in FIG. 2 in further detail.

With respect to FIG. 3, the clock modifier 151 shown in FIG. 2 is shown in further detail. Furthermore the operation of such a clock modifier 151 is described with respect to the flow diagram shown in FIG. 4. The clock modifier 151, in some embodiments, comprises a seed generator 201. The seed generator 201 can be configured, in some embodiments, to generate at least two values, two seed values suitable for use in generating at least one pseudo-random variable to be applied to the clock tree source generators. In some embodiments, the seed generator 201 can be configured to generate further variables further defining the possible clock modification values. For example, in some embodiments the seed generator 201 can furthermore determine or generate a value representing the jitter variable range. The seed values and jitter range can in some embodiments be defined during simulation time using tool command language (Tcl) to drive the variables for each clock domain via the simulation tool. In some embodiments, the jitter range can be safely defined as being up to half the period of the original clock value. In some embodiments, as the seed values must be variables and variables cannot be forced into VHDL, two signals of type 'positive' are forced to the required seed value at the start of the simulation and these can in some embodiments be assigned to variables on the first clock edge of the simulation within the process.

Figure 4:
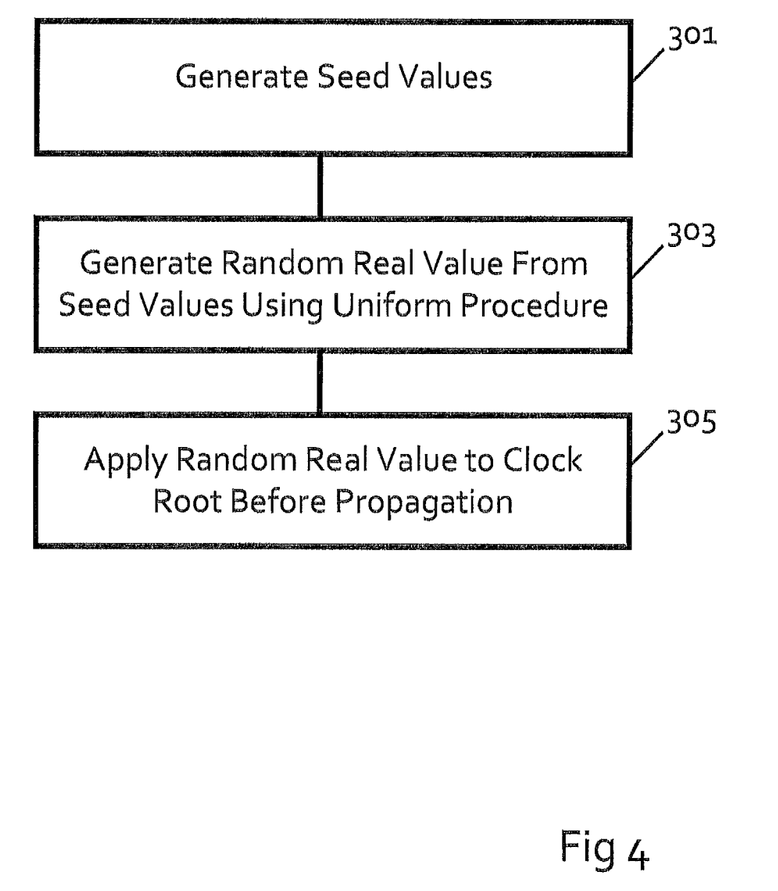
FIG. 4 shows a method of generating the root clock for at least one of multiple clock domains used in a system on chip arrangement as shown in FIG. 1.

The operation of generating the seed values is shown in FIG. 4 by step 301.

In some embodiments, the clock generator 101 and specifically the clock modifier 151 can comprise a jitter determiner 203. The seed generator 201, in such embodiments, can be coupled to the jitter determiner 203.

The jitter determiner 203 can be configured to receive the seed values and from the seed values generate a pseudorandom variable to be used as a jitter or delay for the clock source values.

In some embodiments, jitter determiner 203 can use the seed values to define a pseudo-random, or complex non-linear or chaotic process from which a value can be generated.

For example, in some embodiments the seed values can be used by the uniform procedure from the VHDL ieee.math_real package to model an adjustable jitter for each of the timing or clock domains.

The operation of generating a random real value from the seed value(s) is shown in FIG. 4 by step 303.

Furthermore, in some embodiments, the jitter determiner 203 is configured to be coupled to each clock tree source and pass to each clock tree source a jitter or delay random or pseudo-random real value. Each of the clock tree sources can furthermore be configured to apply the jitter or delay value in such a way to delay the initial clock edge generated by the clock tree source. Thus, for example, the jitter determiner 203 can be configured to pass a first jitter value to the first clock tree source 103 to delay the initial clock edge by the first jitter value, a second jitter value to the second clock tree source 105 to delay the second clock initial clock edge by the second jitter value and a n'th jitter value to the n'th clock tree source 107 to delay the n'th clock initial clock edge by the n'th jitter value.

The operation of applying the random real value to the clock root before propagation to the clock domain is shown in FIG. 4 by step 305.

An example of the code used in some embodiments for the defining of the seed values is shown below.

In a first example, a register transfer level definition of the architecture specifying the root clock, seed values and jitter range is shown

```
ARCHITECTURE rtl OF clock_outstage IS
    SIGNAL root_clock: std_logic;
    SIGNAL jitter_range : time := 0 ns;
    SIGNAL seed1 : positive;
    SIGNAL seed2 : positive;
BEGIN
    //code to generate "root_clock">
    ....
```

An example implementation of the VHDL process can be:

```
clock_jitter: PROCESS(root_clk)
    VARIABLE jitter_real : real;
```

```
    VARIABLE jitter_time : time;
    VARIABLE seed1_v : positive;
    VARIABLE seed2_v : positive;
    VARIABLE first : boolean;
BEGIN
    IF (Rising_edge(root_clk) and first = FALSE) THEN
        seed1_v := seed1;
        seed2_v := seed2;
        first := TRUE;
    END IF;
    UNIFORM(seed1_v, seed2_v, jitter_real);
    jitter_time := jitter_real * jitter_range;
    root_clock_skewed <= root_clk AFTER jitter_time;
END PROCESS;
```

Furthermore, an example UNIFORM implementation can be procedure UNIFORM(variable SEED1,SEED2:inout POSITIVE; variable X:out REAL)

```
is
    -- Description:
    --      See function declaration in IEEE Std 1076.2-1996
    -- Notes:
    --      a) Returns 0.0 on error
    --
    variable Z, K: INTEGER;
    variable TSEED1 : INTEGER := INTEGER'(SEED1);
    variable TSEED2 : INTEGER := INTEGER'(SEED2);
begin
    -- Check validity of arguments
    if SEED1 > 2147483562 then
        assert FALSE
            report "SEED1 > 2147483562 in UNIFORM"
            severity ERROR;
        X := 0.0;
        return;
    end if;
    if SEED2 > 2147483398 then
        assert FALSE
            report "SEED2 > 2147483398 in UNIFORM"
            severity ERROR;
        X := 0.0;
        return;
    end if;
    -- Compute new seed values and pseudo-random number
    K := TSEED1/53668;
    TSEED1 := 40014 * (TSEED1 - K * 53668) - K * 12211;
    if TSEED1 < 0 then
        TSEED1 := TSEED1 + 2147483563;
    end if;
    K := TSEED2/52774;
    TSEED2 := 40692 * (TSEED2 - K * 52774) - K * 3791;
    if TSEED2 < 0 then
        TSEED2 := TSEED2 + 2147483399;
    end if;
    Z := TSEED1 - TSEED2;
    if Z < 1 then
        Z := Z + 2147483562;
    end if;
    -- Get output values
    SEED1 := POSITIVE'(TSEED1);
    SEED2 := POSITIVE'(TSEED2);
    X := REAL(Z)*4.656613e-10;
end UNIFORM;
```

In such embodiments, by applying a unique seed value to the jitter applied to each clock domain or in other words by applying a deterministic pseudo random delay to each clock domain edge it is possible to avoid harmonic adjustment and thus ensuring a wide coverage of clock edge scenarios. Furthermore, the deterministic nature of the jitter/delay value is that where a test or simulation highlights a failure in an asynchronous handover of data between clock domains the process is repeatable for a given combination of seeds.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this invention may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Whilst this detailed description has set forth some embodiments of the present invention, the appended claims cover other embodiments of the present application which differ from the described embodiments according to various modifications and improvements. Other applications and configurations may be apparent to the person skilled in the art.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A circuit simulator for testing and verification of an integrated circuit with multiple clock domains, the circuit simulator comprising:
   at least one clock generator configured to generate a series of root clock signals each of which is used during the testing and verification in an associated clock domain of the multiple clock domains for the integrated circuit under simulation; and
   a clock modifier comprising a jitter determiner configured to generate at least one variable to be applied as jitter by the at least one clock generator to each initial clock domain edge to avoid harmonic adjustment and to cause a constant re-skewing of clock domain edges with respect to the associated clock domain of the multiple clock domains for the integrated circuit during simulation.

2. The circuit simulator as claimed in claim 1, wherein the jitter determiner comprises at least one of:
   a pseudo-random value determiner;
   a deterministic value determiner;
   a non-linear value determiner;
   a UNIFORM value determiner;
   a chaotic value determiner; and
   a deterministic random value determiner.

3. The circuit simulator as claimed in claim 1, wherein the clock modifier further comprises a seed generator configured to determine at least one seed value, wherein the jitter determiner is configured to determine the at least one variable to be applied as jitter based on the at least one seed value.

4. The circuit simulator as claimed in claim 3, wherein the at least one seed value is a real positive value defined using tool command language.

5. The circuit simulator as claimed in claim 1, wherein the associated clock domain of the multiple clock domains for the integrated circuit under simulation includes at least one of:
   a gate level simulation; and
   a register transfer level simulation.

6. The circuit simulator as claimed in claim 1, further comprising a verifier configured to verify the circuit under simulation.

7. A method for testing and verification of an integrated circuit, under simulation, with multiple clock domains, the method comprising:
   generating a series of root clock signals each of which is used during the testing and verification in an associated clock domain of the multiple clock domains for the integrated circuit under simulation; and
   generating at least one variable to be applied as jitter to each initial clock domain edge to avoid harmonic adjustment and to cause a constant re-skewing of clock domain edges with respect to the associated clock domain of the multiple clock domains for the integrated circuit during simulation.

8. The method as claimed in claim 7, wherein generating at least one variable to be applied as jitter to root clock signals comprises determining at least one value representing the at least one variable.

9. The method as claimed in claim 8, wherein determining the at least one variable to be applied as jitter comprises at least one of:
   determining a pseudo-random value;
   determining a deterministic value;
   determining a non-linear value;
   determining a UNIFORM value;
   determining a chaotic value; and
   determining a deterministic random value.

10. The method as claimed in claim 8, wherein generating at least one variable further comprises determining at least one seed value, wherein determining at least one value representing the at least one variable comprises determining the at least one variable to be applied as jitter based on the at least one seed value.

11. The method as claimed in claim 10, wherein determining the at least one seed value comprises defining the at least one seed value using tool command language.

12. The method as claimed in claim 7, further comprising gate level simulating an integrated circuit part having the associated clock domain of the multiple clock domains for the integrated circuit during simulation.

13. The method as claimed in claim 7, further comprising register transfer level simulating an integrated circuit part having the associated clock domain of the multiple clock domains for the integrated circuit during simulation.

14. An apparatus for circuit simulation including testing and verification of an integrated circuit with multiple clock domains, the apparatus comprising:
   at least one processor; and
   at least one memory including computer code, the at least one memory and the computer code configured to cause the at least one processor to
      generate a series of root clock signals each of which is used during the testing and verification of an associated clock domain of the integrated circuit under simulation, and
      generate at least one variable to be applied as jitter to each initial clock domain edge to avoid harmonic adjustment and to cause a constant re-skewing of clock domain edges with respect to the associated clock domain of the multiple clock domains for the integrated circuit during simulation.

15. The apparatus as claimed in claim 14, wherein determining the at least one variable causes the apparatus to perform at least one of:
   determining a pseudo-random value;
   determining a deterministic value;
   determining a non-linear value;
   determining a UNIFORM value;
   determining a chaotic value; and
   determining a deterministic random value.

16. The apparatus as claimed in claim 14, wherein generating at least one variable to be applied as jitter further causes the apparatus to perform determining at least one seed value, wherein determining at least one variable causes the apparatus to perform determining the at least one variable based on the at least one seed value.

17. The apparatus as claimed in claim 16, wherein determining the at least one seed value causes the apparatus to perform defining the at least one seed value using tool command language.

18. The apparatus as claimed in claim 14, wherein the at least one memory and the computer code are configured to cause the at least one processor to perform gate level simulating an integrated circuit part having the associated clock domain of the multiple clock domains for the integrated circuit during simulation.

19. The apparatus as claimed in claim 14, wherein the at least one memory and the computer code are configured to cause the at least one processor to perform register transfer level simulating an integrated circuit part having the associated clock domain of the multiple clock domains for the integrated circuit during simulation.

* * * * *